United States Patent
Kim

(10) Patent No.: US 7,710,775 B2
(45) Date of Patent: May 4, 2010

(54) CELL ARRAY OF MEMORY DEVICE SHARING SELECTION LINE

(75) Inventor: Ho-Jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 329 days.

(21) Appl. No.: 11/781,287

(22) Filed: Jul. 23, 2007

(65) Prior Publication Data

US 2008/0049501 A1 Feb. 28, 2008

(30) Foreign Application Priority Data

Jul. 24, 2006 (KR) .................. 10-2006-0069349

(51) Int. Cl.
*G11C 7/10* (2006.01)
(52) U.S. Cl. ................. 365/185.05; 365/185.17; 365/63
(58) Field of Classification Search ........... 365/185.05, 365/185.17, 63
See application file for complete search history.

(56) References Cited

U.S. PATENT DOCUMENTS

| | | | | |
|---|---|---|---|---|
| 5,541,879 A | * | 7/1996 | Suh et al. ............... | 365/185.22 |
| 5,546,341 A | * | 8/1996 | Suh et al. ............... | 365/185.33 |
| 5,696,717 A | * | 12/1997 | Koh ..................... | 365/185.22 |
| 5,940,321 A | * | 8/1999 | Takeuchi et al. ........ | 365/185.17 |
| 6,353,555 B1 | * | 3/2002 | Jeong ................... | 365/185.11 |
| 6,370,062 B2 | * | 4/2002 | Choi .................... | 365/185.23 |
| 6,545,910 B2 | * | 4/2003 | Byeon et al. ........... | 365/185.17 |
| 6,819,590 B2 | * | 11/2004 | Goda et al. ............ | 365/185.03 |
| 7,518,915 B2 | * | 4/2009 | Noguchi ................ | 365/185.05 |
| 2005/0243602 A1 | | 11/2005 | Umezawa | |

FOREIGN PATENT DOCUMENTS

| | | |
|---|---|---|
| JP | 11-195718 | 7/1999 |
| JP | 2000-149581 | 5/2000 |
| JP | 2005-317138 | 11/2005 |
| KR | 2002-043444 | 2/2002 |
| KR | 1020030013141 A | 2/2003 |
| KR | 1020030019042 A | 3/2003 |
| KR | 2005-071411 | 3/2005 |
| KR | 1020050022277 A | 3/2005 |

* cited by examiner

*Primary Examiner*—Tuan T. Nguyen
(74) *Attorney, Agent, or Firm*—Volentine & Whitt, P.L.L.C.

(57) ABSTRACT

A cell array of a flash memory device includes a memory cell transistor connected to a word line, a first selection transistor for controlling a first connection between the memory cell transistor and a bit line in response to a selection signal, and a second selection transistor for controlling a second connection between the memory cell transistor and a common source line in response to the selection signal.

19 Claims, 5 Drawing Sheets

Fig. 5

Bias Condition

|  | Read | Program | Erase |
|---|---|---|---|
| SSL | Vread | Vcc | F |
| WL | 0 | 18V | 0 |
| CSL | 0 | Vcc | F |
| "0"BL | Vsense | 0 | 0 |
| "1"BL | Vsense | Vcc | 0 |
| Bulk | 0 | 0 | 20 |

CELL ARRAY OF MEMORY DEVICE SHARING SELECTION LINE

CROSS-REFERENCE TO RELATED APPLICATIONS

A claim of priority is made to Korean Patent Application No. 10-2006-0069349, filed on Jul. 24, 2006, the subject mater of which is hereby incorporated by reference.

BACKGROUND OF THE INVENTION

1. Field of the Invention

The present invention relates to a semiconductor memory device and, more particularly, to a flash memory device capable of performing high speed read and write operations.

2. Description of the Related Art

In general, a flash memory having eXecution In Place (XIP) functionality may be used for a portable device, for example, that requires memory having a small size or a short boot time. The XIP functionality enables programs to be executed directly from the flash memory. Codes stored in an XIP flash memory may be executed within the flash memory without first having to transfer the execute codes into random access memory (RAM). The XIP functionality enables the same execution of many application programs, while reducing the required RAM capacity.

Historically, typical NAND flash memories were not able to provide XIP functionality, so NOR flash memories were used as XIP memories. Recently, though, NAND flash memories capable of supporting XIP functionality have been developed. NAND flash memories may be desirable over NOR flash memories as XIP memories due to their low cost and high density.

A metal strapping technique has been used to reduce resistance of a signal line, e.g., formed of polysilicon, having a relatively large resistance. A signal line formed by the metal strapping technique may reduce the resistance using a metal conductor and a contact formed on the signal line, improving a signal transfer speed of the semiconductor device. A reduction in signal line resistance may enable a corresponding reduction in power. Also, a signal line (e.g., a common source line) formed by the metal strapping technique reduces coupling effect to increase operating reliability.

FIG. 1 is a circuit diagram showing a structure of a conventional XIP flash memory. Referring to FIG. 1, the XIP flash memory includes memory cell units 10, 20, 30 and 40, each of which has two selection transistors ST<n> and GT<n> and one cell transistor MC<n>. For convenience of description, the cell structure of the XIP flash memory will be described referring to only one memory cell unit, the memory cell unit 10, as an example.

The selection transistors ST<0> and GT<0> of the memory cell unit 10 respectively correspond to the string selection transistor SST and the ground selection transistor GST of a typical NAND flash memory. However, the memory cell unit 10 of the XIP flash memory may include only one cell transistor MC<0>, where a typical NAND flash memory may include multiple cell transistors connected in series between the string selection transistor and the ground selection transistor. The memory cell unit 10 is supplied with selection signals through the selection signal lines SSL<0> and GSL<0> and with a word line voltage through a word line WL<0>. The lines SSL<0>, WL<0> and GSL<0> are selectively connected to the memory cell unit 10 via high voltage switches PG<0>, PG<1> and PG<2>, respectively, which are switched on under the control of an X-decoder (not shown).

As illustrated in FIG. 1, three high-voltage switches are used to transfer control signals to each of the memory cell units 10, 20, 30 and 40. Also, the memory cell units 10 and 20 share a bit line BL<0> and a common source line CSL, and the memory cell units 30 and 40 share a bit line BL<1> and the common source line CSL.

FIG. 2 is a diagram showing a cross-section taken along a dashed line A-A' in FIG. 1. FIG. 2 shows a schematic cross-section of the memory cells when a metal strapping technique is applied to word lines in an XIP flash memory. Referring to FIG. 2, in general, the control gates of selection transistors ST<0>, ST<2>, GT<0> and GT<2> are respectively connected to corresponding metal strapping lines MS1, MS3, MS5 and MS7 via contacts, and the control gates of the cell transistors MC<0> and MC<2> are respectively connected to corresponding metal strapping lines MS2 and MS6 via contacts. A common source line CSL formed on a diffusion layer in a P-type substrate is connected to a metal strapping line MS4.

In this configuration, seven metal strapping lines MS1 to MS7 are required for two memory cell units sharing the common source line and a bit line. The metal strapping lines of the XIP flash memory increase the chip size. Also, although the metal strapping lines have lower resistance than polysilicon lines, it is difficult to form the metal strapping lines and to reduce their corresponding line widths. Accordingly, increases in operation reliability and speed of an XIP flash memory is accompanied by increased cost.

SUMMARY OF THE INVENTION

An aspect of the present invention provides a cell array structure of a flash memory device. The cell array structure includes a memory cell transistor connected to a word line; a first selection transistor for controlling a first connection between the memory cell transistor and a bit line in response to a selection signal; and a second selection transistor for controlling a second connection between the memory cell transistor and a common source line in response to the selection signal. The word line may include a gate line of the memory cell transistor. Also, the selection signal may be supplied to a first gate line of the first selection transistor and a second gate line of the second selection transistor.

The cell array structure may further include a first strapping line positioned on the word line and electrically connected to the word line, and a second strapping line positioned on one of the first gate line and the second gate line, and electrically connected to the one of the first gate line and the second gate line. A third strapping line may be positioned on and connected to a diffusion layer in which the common source line is located.

The cell array structure may also include a first switch for supplying a word line voltage to the word line, and a second switch for supplying the selection signal to the first gate line of the first selection transistor and to the second gate line of the second selection transistor. The first gate line of the first selection transistor and second gate line of the second selection transistor may be connected by a local interconnection. The local interconnection may be positioned on a different conduction layer than the first strapping line.

Another aspect of the present invention provides a flash memory device, including a first switch for supplying a selection signal to a selection signal line and a second switch for supplying a word line voltage to a word line. A memory cell transistor is connected to the word line. A first selection transistor, for controlling a first connection between the memory cell transistor and a bit line in response to the selection signal, is connected to the selection signal line. A second selection transistor, for controlling a second connection between the memory cell transistor and a common source line in response to the selection signal, is connected to the selection signal line.

The selection signal line may be a first gate line of the first selection transistor and a second gate line of the second selection transistor. One of the first gate line and the second gate line may be electrically connected to a first strapping line, and the word line may be electrically connected to a second strapping line. Also, the common source line may be electrically connected to a third strapping line.

The first gate line and the second gate line may be electrically connected to each other by a local interconnection, which extends in a direction of the bit line. The local interconnection may be positioned on a conduction layer different from a conduction layer of the first strapping line.

Yet another aspect of the present invention provides a cell array structure of a flash memory device, including multiple memory cell units arranged in rows and columns. Each memory cell unit includes a first selection transistor, a memory cell transistor and a second selection transistor, connected in series between a corresponding column and a common source line. A first gate line of the first selection transistor is electrically connected to a second gate line of the second selection transistor.

The cell array structure may further include a first strapping line positioned on one of the first gate line and the second gate line, and electrically connected to the one of the first gate line and the second gate line. Also, a second strapping line may be positioned on a gate line of the memory cell transistor and electrically connected to the gate line of the memory cell transistor. A third strapping line may be positioned on and electrically connected to a diffusion layer in which the common source line is positioned.

The first gate line of the first selection transistor may be electrically connected to the second gate line of the second selection transistor by a local interconnection, located on a conduction layer different from a conduction layer of the first strapping line. The cell array structure may further include a first switch for supplying a word line voltage to a word line of the memory cell transistor; and a second switch for supplying a selection signal to the first gate line of the first selection transistor and the second gate line of the second selection transistor.

BRIEF DESCRIPTION OF THE DRAWINGS

The embodiments of the present invention will be described with reference to the attached drawings, in which:

FIG. 5 is a diagram showing a bias condition of operations of an XIP flash memory, according to an exemplary embodiment of the present invention.

DETAILED DESCRIPTION OF THE EMBODIMENTS

Figure 1:
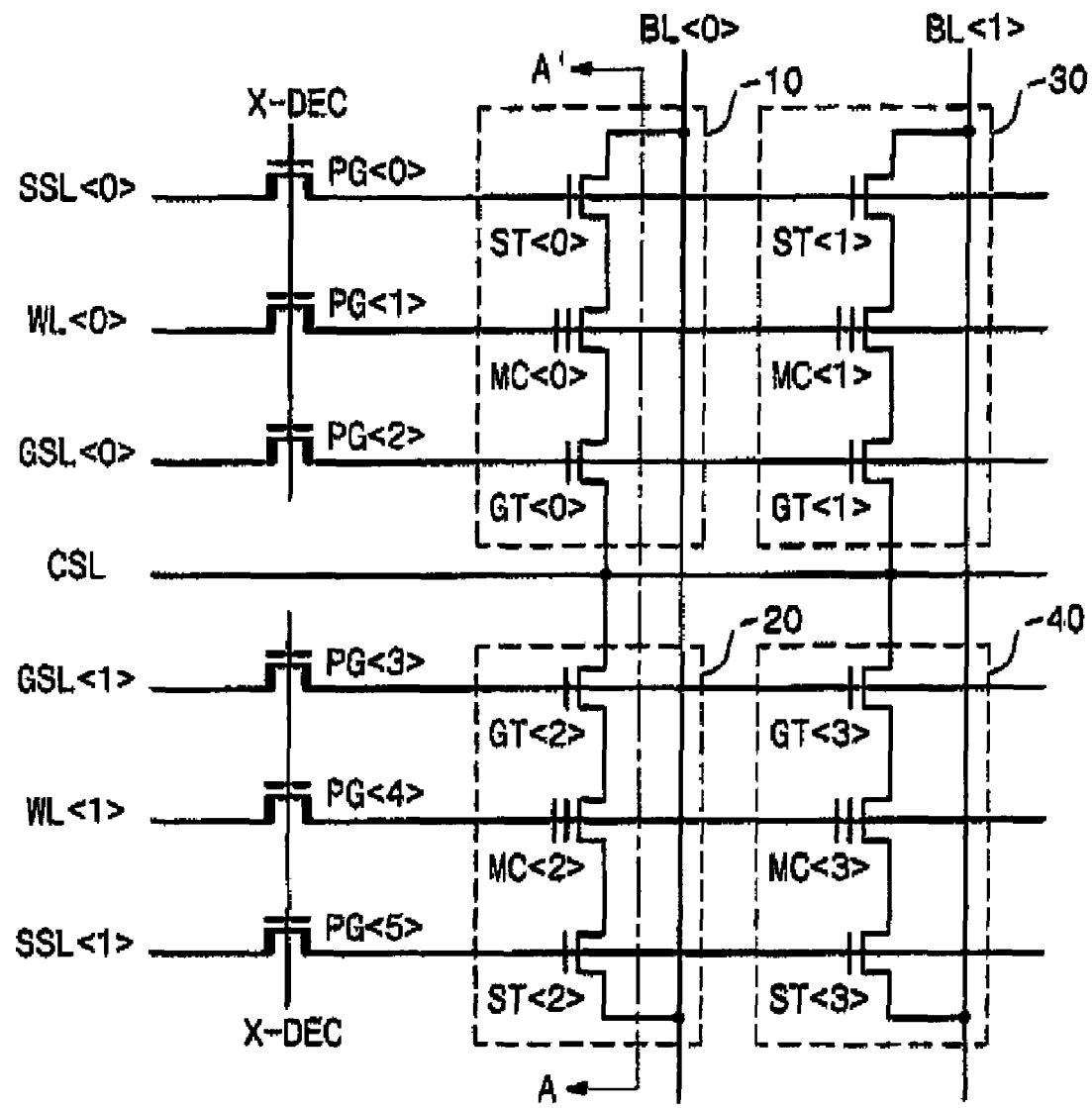
FIG. 1 is a circuit diagram showing a structure of a conventional XIP flash memory.
Figure 2:
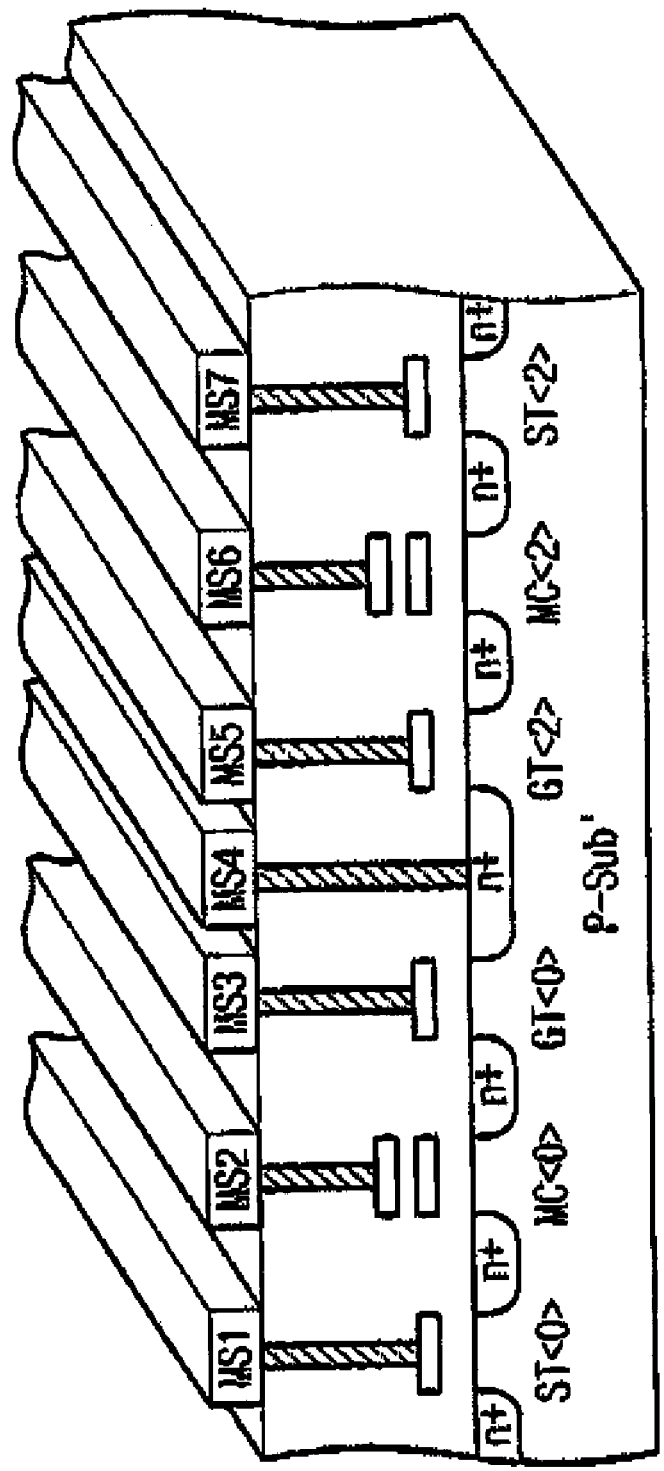
FIG. 2 is a diagram showing a cross-section taken along a dotted line A-A' of FIG. 1.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 3:
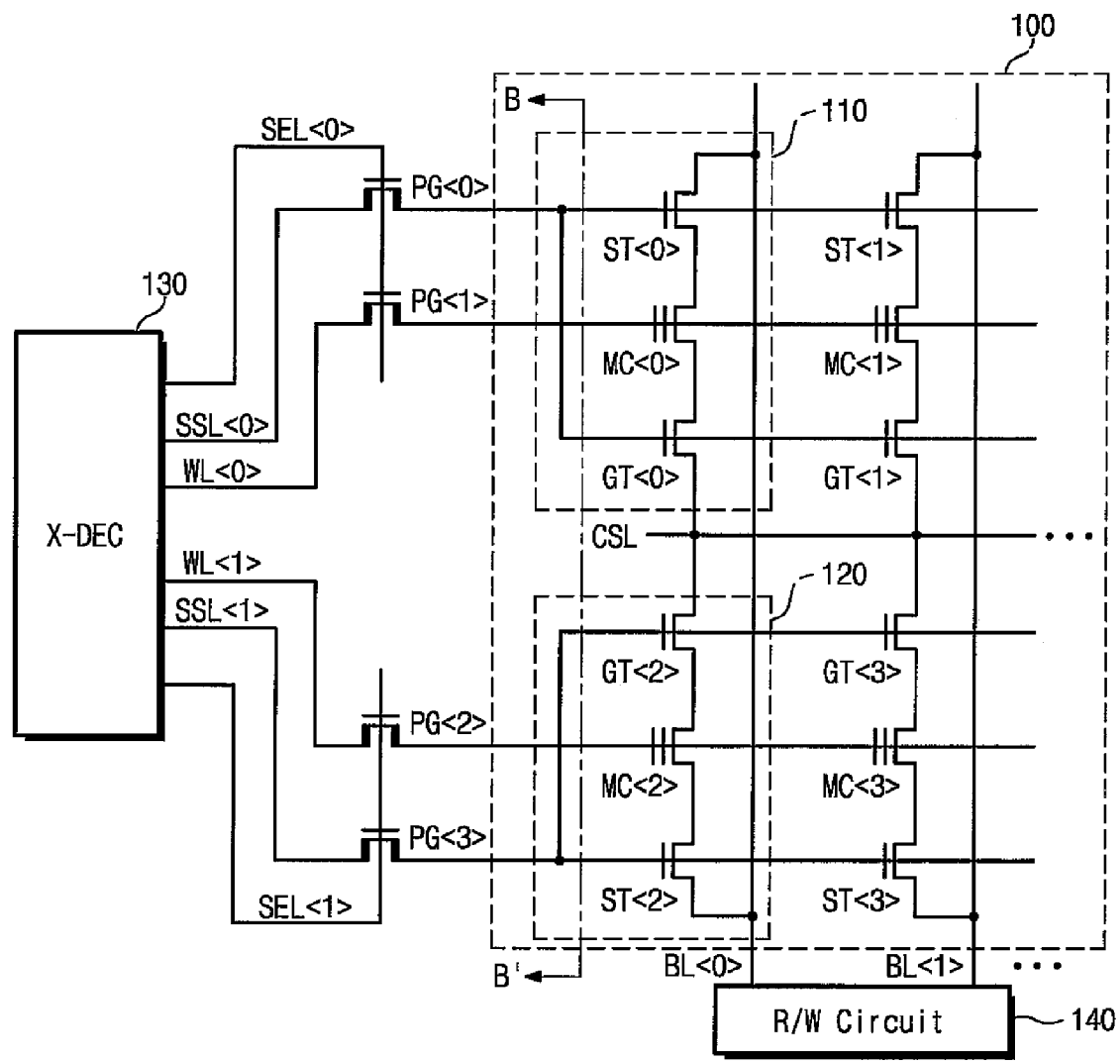
FIG. 3 is a circuit diagram showing a structure of an XIP flash memory, according to an exemplary embodiment of the present invention.

FIG. 3 is a circuit diagram showing a cell array structure 100 of a flash memory, according to an exemplary embodiment of the present invention. Referring to FIG. 3, an XIP flash memory device is configured to reduce the number of high voltage switches that is used per memory cell unit. Further, the flash memory device may be configured to share a selection signal line SSL, so that a metal strapping line is provided for a word line and a metal strapping line is provided for a selection signal (for multiple selection transistors), which will be more fully described below.

A memory cell unit 110 of the cell array 100 is configured similarly to the memory cell unit 10 illustrated in FIG. 1. That is, the one memory cell unit 110 includes two selection transistors ST<0> and GT<0> and a memory cell transistor MC<0>. The selection transistor ST<0> is configured to selectively connect a drain of the memory cell transistor MC<0> to a bit line BL<0>, and the selection transistor GT<0> is configured to selectively connect a source of the memory cell transistor MC<0> to a common source line CSL. The memory cell transistor MC<0> is supplied with a gate voltage via a word line WL<0>, and is connected to the bit line BL<0> and the common source line CSL via the selection transistors ST<0> and GT<0>, respectively.

In accordance with the present embodiment, gate voltages of the selection transistors ST<0> and GT<0> are supplied via the selection signal line SSL<0> at the same time. Thus, no separate high voltage switch is needed to supply a signal for controlling the selection transistor GT<0> (or GT<2> of memory cell unit 120), for example. Accordingly, a selection signal (e.g., SEL <0>) for selecting one memory cell unit (e.g., memory cell unit 110) is transferred via one high voltage switch (e.g., high voltage switch PG<0>). Another high voltage switch PG<1 > supplies a word line voltage of a memory cell transistor MC<0>, similar to the high voltage switch PG<1> in FIG. 1.

Accordingly, the reliability of the signal lines may be improved without having a strapping line associated with every transistor in a memory cell unit. For example, with respect to the two memory cell units 110 and 120 sharing a common source line CSL, metal strapping lines are formed with respect to the control gate lines (conductors, such as polysilicon) of the selection transistors ST<0> and ST<2>. Metal strapping lines are also formed with respect to the control gate lines (conductors, such as polysilicon) of the cell transistors MC<0> and MC<2>. In contrast, no metal strapping lines are formed with respect to the control gate lines of the selection transistors GT<0> and GT<2>. However, the control gate lines of the selection transistors GT<0> and GT<2> are connected to the metal strapping lines formed with respect to the control gate lines of the selection transistors ST<0> and ST<2>, using a local interconnection, which may be located on a layer different from the layer on which the metal strapping lines are formed.

Accordingly, it is possible to control the selection transistors ST<0> and GT<0> of the memory cell unit 110, for example, through a selection signal line SSL<0> at the same time. Program, read and erase operations of the cell transistor MC<0> may be carried out by controlling the above-described lines WL<0>, SSL<0>, CSL and BL<0>.

An X-decoder 130 is configured to supply a word line voltage WL<n>, a selection signal SSL<n>, and a switching signal SEL<n> for switching the word line voltage and the selection signal to a selected memory cell unit. In an embodiment, the X-decoder 130 may supply all gate voltages of a memory cell unit 110 via two high voltage switches PG<0> and PG<1>. Also, a read/write circuit 140 is configured to a bias voltage to bit lines in read and write operations under the cell array structure 100.

In accordance with a cell array structure in FIG. 3, the total number of metal strapping lines is reduced, even though a dedicated metal strapping line is applied to a word line. Also, the number of high voltage switches per cell unit is reduced, making it possible to reduce a chip size.

Figure 4:
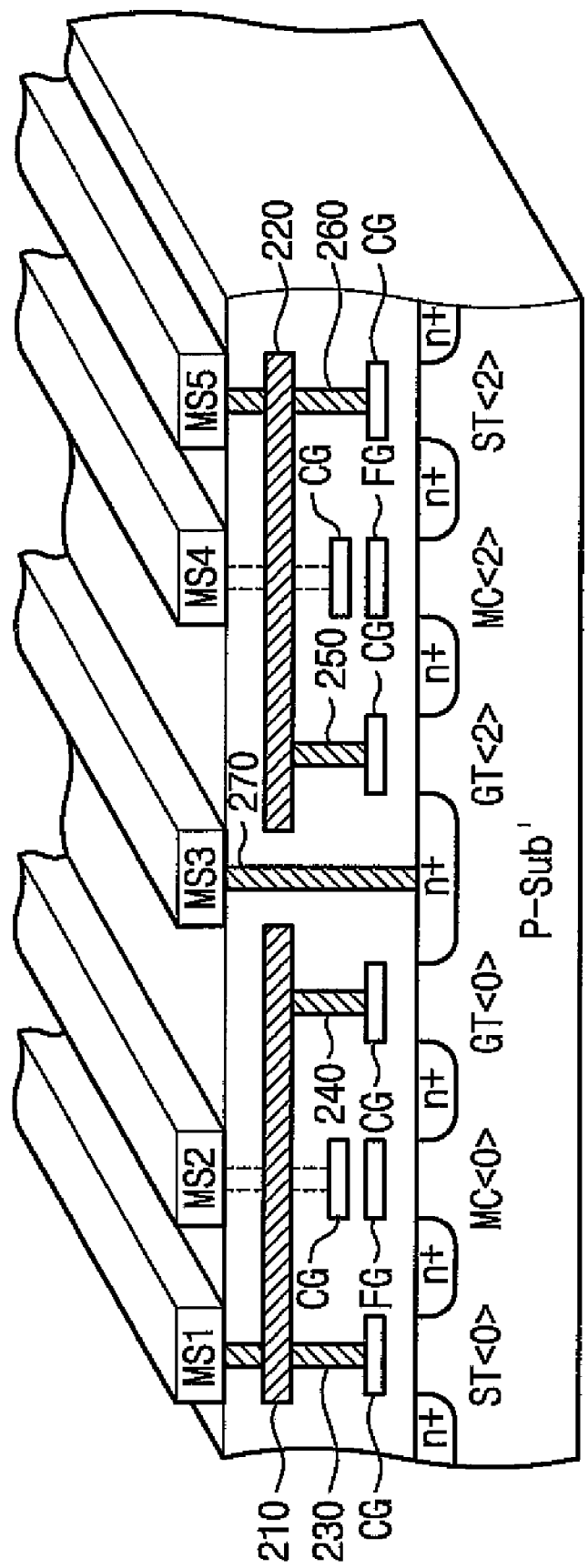
FIG. 4 is a diagram showing a cross-section taken along a dotted line B-B' in FIG. 3.

FIG. 4 is a diagram showing a cross-section taken along a dashed line B-B' of FIG. 3. Referring to FIG. 4, control gate lines 230 and 240 of selection transistors ST<0> and GT<0> are electrically connected by a local interconnection 210 (L1) at a layer different from the layer on which a metal strapping line is formed. Control gate lines 250 and 260 of selection transistors GT<2> and ST<2> are electrically connected by a local interconnection 220 (L2). The local interconnection 210 is connected by a metal strapping line MS1 and a contact plug, and the local interconnection 220 is connected by a metal strapping line MS5 and a contact plug.

Although not shown in FIG. 4, a gate of a memory cell transistor MC<0> may be connected to a metal strapping line MS<2>, and a gate of a memory cell transistor MC<2> may be connected to a metal strapping line MS<4>. A common source line CSL 270 may be formed by connecting a metal strapping line MS<3> to an active region (indicated as n+) formed between the selection transistor GT<0> and selection transistor GT<2>. In an embodiment, the common source line CSL 270 is formed of a diffusion layer in the P-type substrate, for example.

As a result, five metal lines forming metal strapping lines MS1-MS5 are needed for each pair of memory cell units (e.g., memory cell units 110 and 120) sharing a common source line CSL. In case of an XIP flash memory according to the present embodiment, it is possible to reduce resistance and increase the signal transfer speed by applying a metal strapping line to a word line. Also, although a metal strapping line is applied to a word line, a cell array structure of the present embodiment enables the number of metal strapping lines to be reduced. Further, it is possible to reduce a chip size through reduction of high voltage switches, which would otherwise occupy a relatively large region in a chip.

Although the metal strapping lines are applied to gate lines of selection transistors ST<0> and ST<2>, the present invention is not limited thereto. That is, in alternative embodiments, a metal strapping line may be applied with respect to gate lines of the selection transistors GT<0> and GT<2>. In this case, a gate line, e.g., formed of polysilicon, of each of the selection transistors ST<0> and ST<2> is connected through a local interconnection to gate lines of the selection transistors GT<0> and GT<2>.

FIG. 5 is a diagram showing a bias condition of an XIP flash memory according to an exemplary embodiment of the present invention. Referring to FIG. 5, during a read operation, a read voltage Vread (e.g., about 4.5V) is applied to a string selection line SSL, and 0V is applied to a word line WL and a common source line CSL. A bit line BL is supplied with a voltage Vsense (e.g., about 1.2V) for sensing and amplifying a program state of a cell transistor MC.

During a program operation, a power supply voltage Vcc is applied to the string selection line SSL, which turns on selection transistors ST and GT. This means that a program voltage Vpgm is supplied to the string selection line SSL. The power supply voltage Vcc transferred to the string selection line SSL is applied to the gates of the selection transistors, and a ground voltage of a bit line BL is supplied to a channel of a cell transistor. According to the program bias condition, electrons are injected into a floating gate of a memory cell transistor to be programmed.

During an erase operation, the string selection line SSL and the common source line CSL are each set to a floating state, and a ground voltage is applied to the word line WL and the bit line BL. At this time, a high voltage of about 20V is applied to a bulk region. According to this bias condition, a memory cell transistor may be erased. That is, electrons in the memory cell transistor's floating gate are discharged into a bulk region.

In accordance with the above bias conditions, no separate ground selection line GSL is needed to transfer control signals for controlling an overall operation of the XIP flash memory. The cell structure provides metal strapping lines to control lines and word lines to perform overall operations of the XIP flash memory.

Considering the above description, although a metal strapping line is provided to a word line, the number of metal lines needed for an overall metal strapping process is reduced. Further, the number of high voltage switches is reduced for supplying word line voltages and control signals. As the number of lines for applying control signals is reduced, a control operation may be simplified. Also, it is possible to apply a metal strap technique to word lines, while reducing the number of metal strapping lines. As the number of high voltage switches for supplying selection signals is reduced, it is possible to provide an XIP flash memory with improved reliability, as well as a reduced chip size.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A cell array structure of a flash memory device, comprising:
   a memory cell transistor connected to a word line;
   a first selection transistor for controlling a first connection between the memory cell transistor and a bit line in response to a selection signal; and
   a second selection transistor for controlling a second connection between the memory cell transistor and a common source line in response to the selection signal,
   wherein the selection signal is supplied to a first gate line of the first selection transistor and a second gate line of the second selection transistor, the first gate line and the second gate line being connected by a local interconnection.

2. The cell array structure of claim 1, wherein the word line comprises a gate line of the memory cell transistor.

3. The cell array structure of claim 2, further comprising:
   a first strapping line positioned on the word line and electrically connected to the word line.

4. The cell array structure of claim 3, further comprising:
   a second strapping line positioned on one of the first gate line and the second gate line, and electrically connected to the one of the first gate line and the second gate line.

5. The cell array structure of claim 4, further comprising:
   a third strapping line positioned on and connected to a diffusion layer in which the common source line is located.

6. The cell array structure of claim 3, wherein the local interconnection is positioned on a different conduction layer than the first strapping line.

7. The cell array structure of claim 1, further comprising:
a first switch for supplying a word line voltage to the word line; and
a second switch for supplying the selection signal to the first gate line of the first selection transistor and to the second gate line of the second selection transistor.

8. A flash memory device, comprising:
a first switch for supplying a selection signal to a selection signal line;
a second switch for supplying a word line voltage to a word line;
a memory cell transistor connected to the word line;
a first selection transistor, connected to the selection signal line, for controlling a first connection between the memory cell transistor and a bit line in response to the selection signal; and
a second selection transistor, connected to the selection signal line, for controlling a second connection between the memory cell transistor and a common source line in response to the selection signal,
wherein the selection signal line comprises a first gate line of the first selection transistor and a second gate line of the second selection transistor, the first gate line and the second gate line being electrically connected to each other by a local interconnection.

9. The flash memory device of claim 8, wherein one of the first gate line and the second gate line is electrically connected to a first strapping line.

10. The flash memory device of claim 9 wherein the word line is electrically connected to a second strapping line.

11. The flash memory device of claim 10, wherein the common source line is electrically connected to a third strapping line.

12. The flash memory device of claim 8, wherein the local interconnection extends in a direction of the bit line.

13. The flash memory device of claim 8, wherein the local interconnection is positioned on a conduction layer different from a conduction layer of the first strapping line.

14. A cell array structure of a flash memory device, comprising:
a plurality of memory cell units arranged in rows and columns, each memory cell unit comprising a first selection transistor, a memory cell transistor and a second selection transistor, connected in series between a corresponding column and a common source line, a first gate line of the first selection transistor being electrically connected to a second gate line of the second selection transistor by a local interconnection.

15. The cell array structure of claim 14, further comprising:
a first strapping line positioned on one of the first gate line and the second gate line, and electrically connected to the one of the first gate line and the second gate line.

16. The cell array structure of claim 15, further comprising:
a second strapping line positioned on a gate line of the memory cell transistor and electrically connected to the gate line of the memory cell transistor.

17. The cell array structure of claim 16, further comprising:
a third strapping line positioned on and electrically connected to a diffusion layer in which the common source line is positioned.

18. The cell array structure of claim 14, wherein the local interconnection is located on a conduction layer different from a conduction layer of the first strapping line.

19. The cell array structure of claim 14, further comprising:
a first switch for supplying a word line voltage to a word line of the memory cell transistor; and
a second switch for supplying a selection signal to the first gate line of the first selection transistor and the second gate line of the second selection transistor.

* * * * *